(12) United States Patent
Park

(10) Patent No.: US 6,642,130 B2
(45) Date of Patent: Nov. 4, 2003

(54) METHOD FOR FABRICATING HIGHLY INTEGRATED TRANSISTOR

(75) Inventor: Cheol Soo Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/323,056

(22) Filed: Dec. 18, 2002

(65) Prior Publication Data

US 2003/0119264 A1 Jun. 26, 2003

(30) Foreign Application Priority Data

Dec. 20, 2001 (KR) .................. 10-2001-0081786

(51) Int. Cl.⁷ ......................................... H01L 21/4763
(52) U.S. Cl. ...................... 438/589; 438/299; 438/270; 438/289
(58) Field of Search ................................. 438/197, 182, 438/217, 223, 259, 268, 270, 289, 291, 299, 300, 301, 303, 305, 306, 307, 585, 586, 592, 589, 595, 597, 652, 655; 257/330

(56) References Cited

U.S. PATENT DOCUMENTS

| | | | |
|---|---|---|---|
| 6,087,706 A | | 7/2000 | Dawson et al. |
| 6,090,661 A | | 7/2000 | Perng et al. |
| 6,150,219 A | * | 11/2000 | Tung .......................... 438/270 |
| 6,309,933 B1 | * | 10/2001 | Li et al. ..................... 438/291 |

* cited by examiner

Primary Examiner—Jack S J Chen
(74) Attorney, Agent, or Firm—Timothy J. Keefer; Wildman, Harrold, Allen & Dixon

(57) ABSTRACT

A method for fabricating a transistor comprises steps of forming a conductive well region, an isolation oxide layer, a first pad oxide layer, a conductive LDD (low doped drain) region and a source/drain region on a silicon substrate. A pad nitride layer is formed on the first oxide layer. A trench is fanned by etching the pad nitride layer, the first oxide layer, the source/drain region, and the LDD region. A second pad oxide layer is then formed on the source/drain region and LDD region. The LDD region and part of the well region are removed after removal of the second pad oxide layer. A gate is formed in the trench, and an interlayer insulating layer is formed on the resultant structure.

11 Claims, 4 Drawing Sheets

METHOD FOR FABRICATING HIGHLY INTEGRATED TRANSISTOR

CROSS REFERENCE TO RELATED APPLICATION

This application claims the priority of Korean patent application Serial No. 2001-81786, filed on Dec. 20, 2001.

BACKGROUND OF THE INVENTION

1. Field of the Invention

The present invention relates to a method for fabricating a transistor in a semiconductor device, and more particularly to a method for fabricating a highly integrated transistor of a trench type.

2. Description of the Prior Art

As generally known in the art, a semiconductor integrated circuit device generally employs MOSFET (Metal Oxide Semiconductor Field Effect Transistor) as unit transistors and integrates lots of unit transistors into one identical semiconductor substrate to embody an integrated circuit. The transistors as explained above have horizontal type structures, they rely more and more on lithography, and effective channels thereof are remarkably weakened following the increase of the degree of integration of semiconductor devices, resulting in the production of several problems as follows.

For example, as the channel of the transistor becomes shorter, there occurs a short channel effect in that threshold voltages decrease or a reverse channel effect in that threshold voltages increase, and a gate induced drain leakage (GIDL) phenomenon occurs in a semiconductor substrate using a thin gate oxide film.

Further, a punch through phenomenon increases, and when the transistor is not activated, leakage current ($I_{OFF}$) increases, junction capacitance in a source/drain region increases, and change of the threshold voltage has occurred.

Meanwhile, various studies and developments have been performed in order to accomplish high current drivability, ultra high speed, and ultra low powers.

SUMMARY OF THE INVENTION

Accordingly, the present invention has been made to solve the above-mentioned problems occurring in the prior art, and an object of the present invention is to provide a highly integrated transistor for a semiconductor device that is capable of high integration and can improve electrical characteristics and reliability of the semiconductor device.

Another object of the present invention is to provide a transistor for a semiconductor device that has reduced production costs and time required for accomplishing the transistor.

In order to accomplish these objects, there is provided a method for fabricating a highly integrated transistor, comprising the steps of: forming a well region having a first conductive type on a silicon substrate; forming an isolation oxide layer on a desired region of a surface of the silicon substrate; forming a first pad oxide layer on the surface of the silicon substrate; forming a LDD (low doped drain) region and a source/drain region on an active region of the silicon substrate, wherein said LDD region and said source/drain region having a second conductive type; forming a pad nitride layer on the first pad oxide layer; forming a trench through sequential etching desired parts of the pad nitride layer, the first pad oxide layer, the source/drain region, and the LDD region to expose side surfaces of the source/drain region and the LDD region; forming a second pad oxide layer along the exposed side surfaces of the source/drain region, the LDD region and on a bottom of the trench; removing a portion of the second pad oxide layer formed at the bottom of the trench and portions of the LDD region and the upper part of the well region; forming a gate in the trench; forming an interlayer insulating layer on the surface of the silicon substrate including the gate; etching the interlayer insulating layer to form contact holes; and forming a source electrode, a drain electrode, and a gate electrode, each of which is electrically connected with the source/drain region and the gate.

In the present method, it is preferable that the etching of the trench-forming step be controlled so that the etching can be stopped at the inside of the LDD region, and furthermore, it is preferable that the etching be performed under a condition in which the etch selection rate of the source/drain region, the LDD region, and the first pad oxide layer with respect to the pad nitride layer is 1:1:1.

Also, it is preferable for the thickness of the second pad oxide layer formed on the respective surfaces of the source/drain region and the LDD region differ from one another, and the second pad oxide layer can be formed through a thermal oxidation process. Further, the step of removing the LDD region and the upper part of the well region and the second pad oxide layer formed at the bottom of the trench can be performed through an anisotropic dry etching.

Meanwhile, the method for fabricating such a transistor further comprises a step of forming a doped region for controlling the threshold voltage at the lower part of the trench prior to forming the gate, and the step of forming the doped region for controlling the threshold voltage can comprise steps of forming a sacrificial oxide layer, implanting ions, and removing the sacrificial oxide layer. Also, the step of forming the gate comprises the steps of depositing gate forming materials on the entire resultant structure in order to fill the trench, and performing planarization of the deposited gate forming materials.

The method for fabricating a highly integrated transistor may also comprise, after the step of forming the gate, a step of forming silicide layers on both the gate and the source/drain region by a self-alignment method, and may further comprise the step of removing the pad nitride layer prior to the forming the interlayer insulating layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
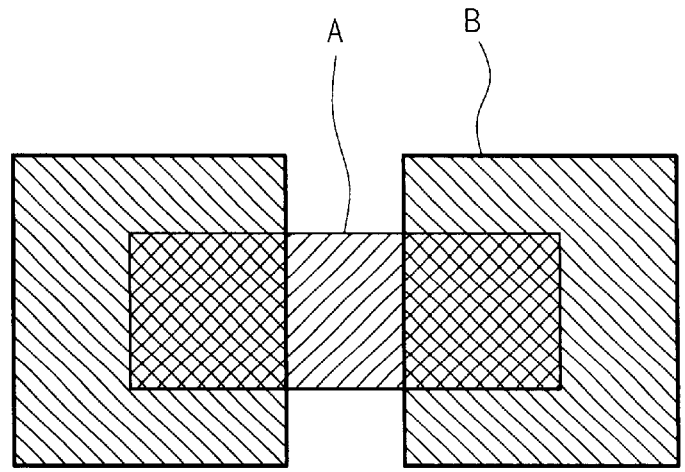
FIG. 1 is a layout view showing a mask employed in a method for fabricating a highly integrated transistor in accordance with one embodiment of the present invention.

FIG. 1 is a layout view showing a mask employed in a method for fabricating a highly integrated transistor in accordance with one embodiment of the present invention, FIGS. 2 to 8 are views showing each step of the method for fabricating a highly integrated transistor in accordance with one embodiment of the present invention.

Referring to FIG. 1, an isolation mask A and a gate mask B are shown. A transistor of the present invention is fabricated by using the masks A, B.

Figure 2:
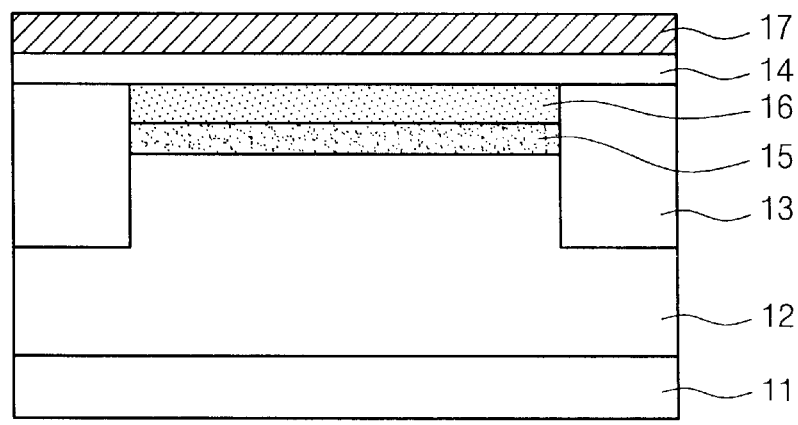
FIGS. 2 to 8 are views showing each step of the method for fabricating a highly integrated transistor in accordance with one embodiment of the present invention.

Referring now to FIG. 2, a P-type well region 12 is formed on a silicon substrate 11, and then an isolation oxide layer 13 is formed using the isolation mask A shown in FIG. 1. Then, a first pad oxide layer 14 is formed on the entire surface of the silicon substrate 11, and an N-LDD (low doped drain) region 15 and a N-type source and drain region 16 (N+S/D) are formed on an active region of the silicon substrate 11 defined by the isolation oxide layer 13. Next, a pad nitride layer 17 is formed on the first pad oxide layer 14.

Figure 3:
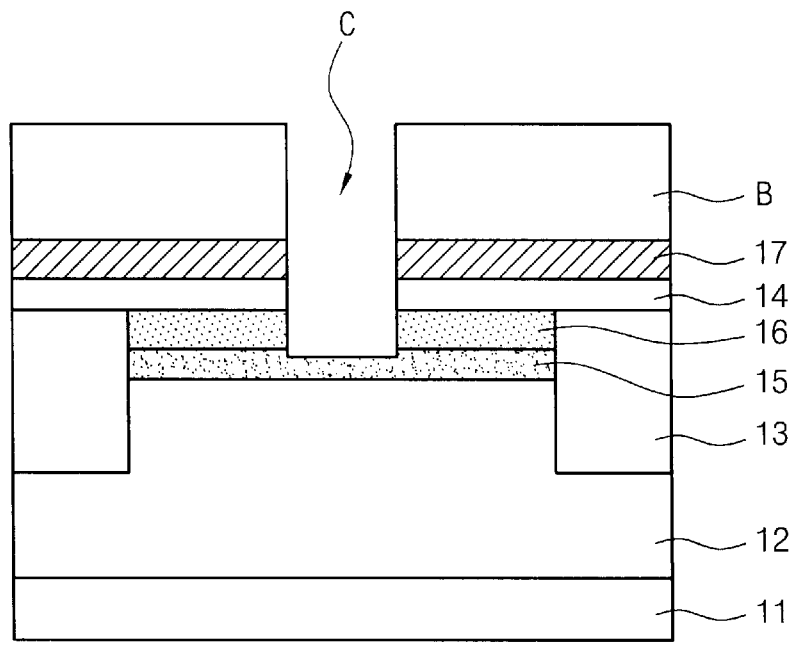

Subsequently, as shown in FIG. 3, a trench C is formed to make a gate by using the gate mask B shown in FIG. 1. Then, photoresist is layered on the gate mask B, and a pad nitride layer 17, a first pad oxide layer 14, an N-type source/drain region 16 and a N-LDD region 15 are sequentially etched to form the trench C. In this instance, the etching process is controlled so that it can be stopped in the N-LDD region 15, and this process is performed in conditions where the etch selection rate between the nitride layer 17, silicon layer on the N-LDD region 15 and the source/drain region 16, and the oxide layer 14 is controlled to be 1:1:1.

Figure 4:
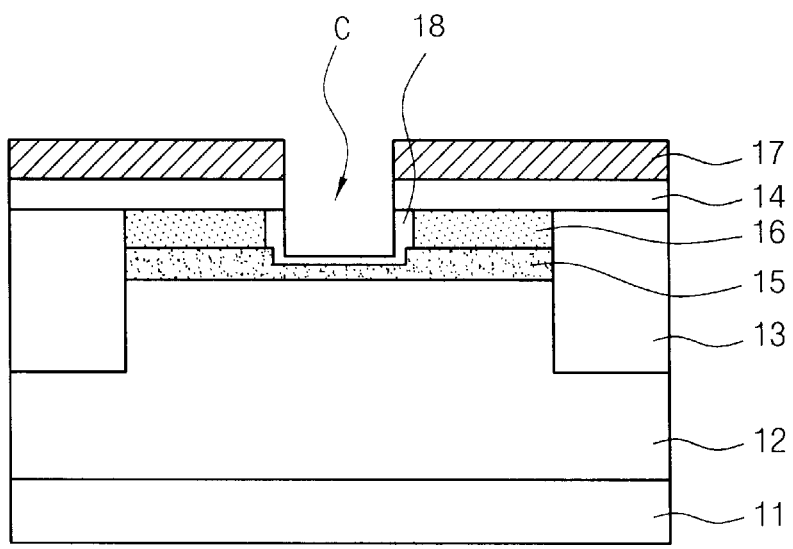

Then, as shown in FIG. 4, a second pad oxide layer 18 is formed after the removal of the photoresist used as the gate mask B and performance of a wet cleaning. The second pad oxide layer 18 is grown along the surface of the N-type source/drain region 16 and the N-LDD region 15 having been exposed at the inside of the trench C by a thermal oxidation process, and the thickness of the second pad oxide layer 18 differs due to the differences between the doping concentrations of the N-type source/drain region 16 and the N-LDD region 15.

Figure 5:
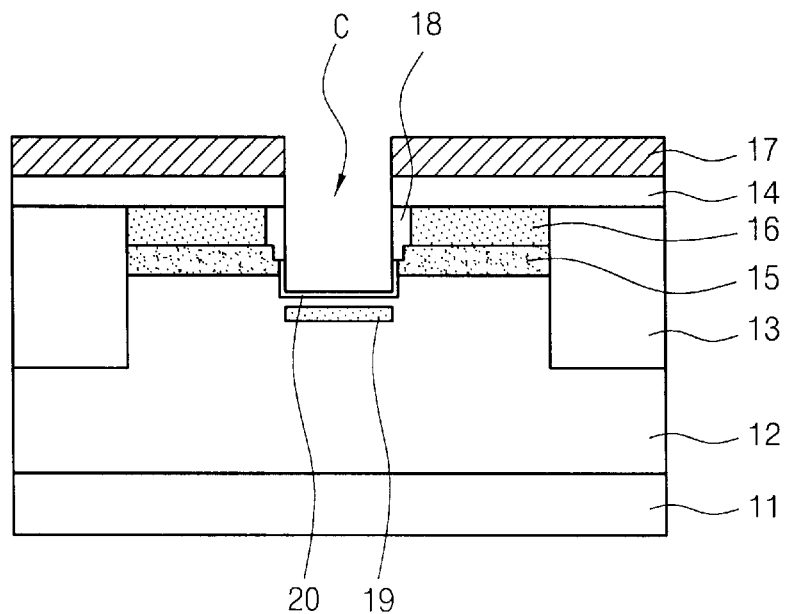

Next, as shown in FIG. 5, the second pad oxide layer 18 formed on the bottom of the trench C is removed by an anisotropic dry etching using a high etch selection rate between the pad nitride layer 17 and the second pad oxide layer 18, and then the silicon layer exposed at the bottom of the trench C is removed by dry etching. The dry etching uses a high etch selection rate between the pad nitride layer 17 and the silicon layer on the P-well region 12 and the N-LDD region 15. The dry etching is performed to penetrate through the N-LDD region 15, resulting in the removal of the upper surface of the P-type well region 12 to a certain thickness (e.g., within some hundreds of Å).

Subsequently, a sacrificial oxide layer (not shown) of a desired thickness is formed, and implantation of ions is performed to control the threshold voltage (Vth) of a channel, thereby resulting in the production of a doped region 19 for controlling the threshold voltage on the lower part of the trench C. Then, the sacrificial oxide layer is removed and a gate insulating layer 20 is formed. The ions implanted to control the threshold voltage are selected from such materials as boron (B), boro-fluoride ($BF_2$), arsenic (As), indium (In), and antimony (Sb), etc.

Figure 6:
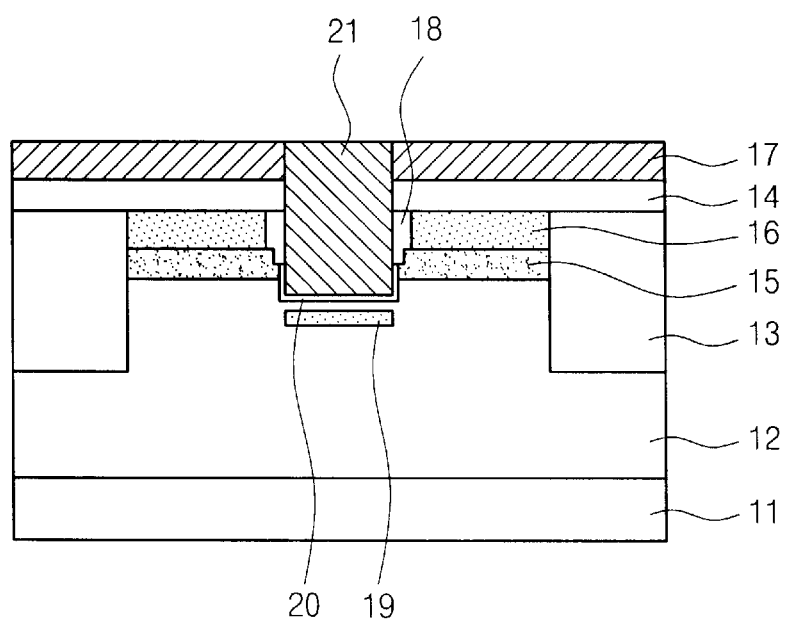

Then, as shown in FIG. 6, gate forming materials are deposited on the entire surface of the resultant structure to fill the inside of the trench C, planarization is performed, and then a gate 21 is formed. For the gate forming materials, a doped polysilicon or an amorphous silicon, etc., can be used, and a chemical-mechanical polishing (CMP) process or a blanket etching-back process can be used as a planarization method.

Figure 7:
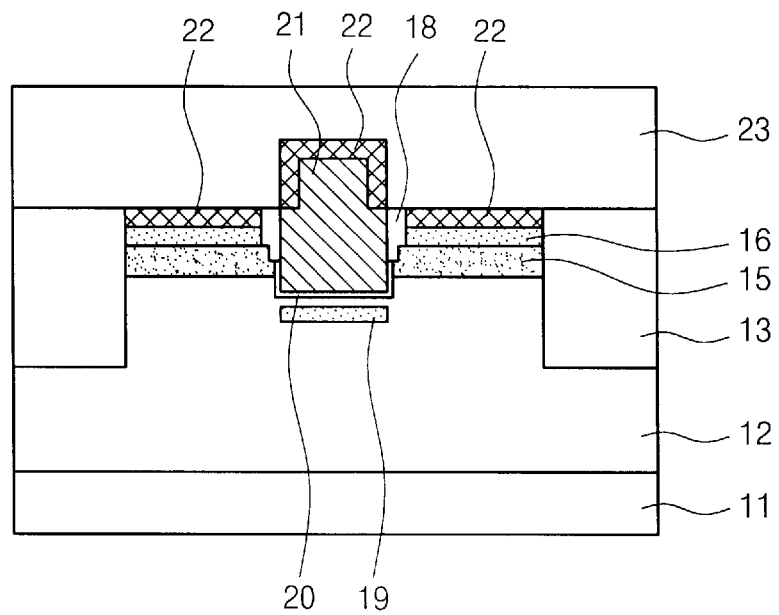

Next, as shown in FIG. 7, a silicide layer 22 is formed on the gate 21 and the N-type source/drain region 16 through a self-alignment method after pad nitride layer 17 and the first pad oxide lever 14 are removed, and an interlayer insulating layer 23 such as a BPSG is formed on the entire resultant structure.

Figure 8:
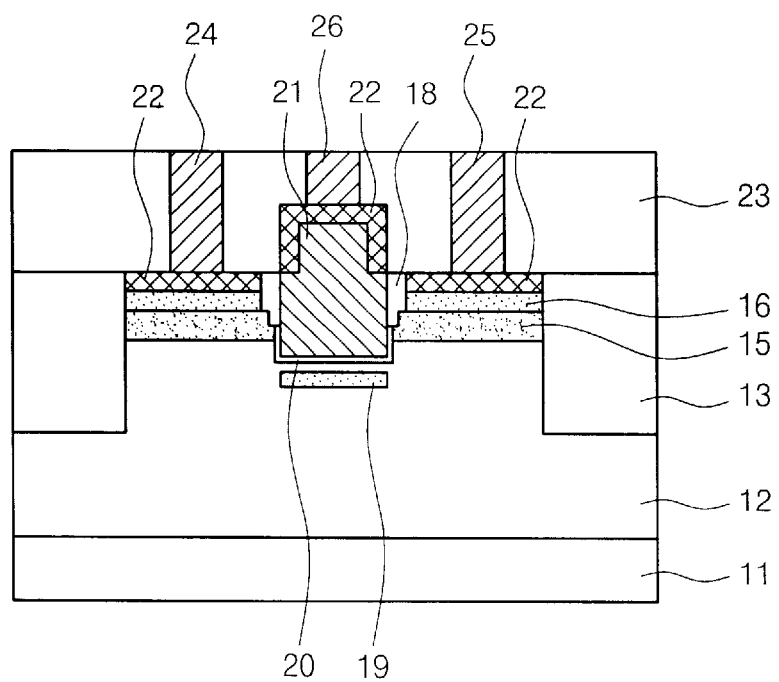

Subsequently, the interlayer insulating layer 23 is selectively etched to expose a desired part of the upper part of the gate 21 and the N-type source/drain region 16 on which the silicide layer 22 has been formed, producing a contact hole, and then metal materials are deposited to fill the contact hole and planarization is performed, thereby resulting in the production of a source electrode 24, a drain electrode 25, and a gate electrode 26 in the respective contact holes, as shown in FIG. 8, which are all connected with the source/drain region 16 and the gate 21.

As described above, the embodiment of the present invention relates to a method for fabricating a transistor having an NMOSFET structure. However, the method of the present invention can be applied to the method for fabricating other devices including a PMOSFET structure, a memory device, and a non-memory device, etc.

Also, as regards the embodiment of the present invention described above, the source/drain region 16 and the N-LDD region 15 can be formed in reverse order, and the source/drain region 16 and the LDD region 15 can be formed at the same time as when the well region is formed.

According to the method for fabricating a transistor of the present invention, the number of masks used in the method for fabricating the transistor can be reduced to ⅓ as compared with that of the conventional method, thereby resulting in the reduction of the production costs and time required for the process.

Also, according to the fabricating method for a transistor of the present invention, electrical characteristics and reliability of a transistor for a semiconductor device can be improved and a high integration of the transistor can be achieved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a highly integrated transistor, comprising the steps of:

forming a well region having a first conductive type on a silicon substrate;

forming an isolation oxide layer on a desired region of a surface of the silicon substrate;

forming a first pad oxide layer on the surface of the silicon substrate;

forming a LDD (low doped drain) region and a source/drain region on an active region of the silicon substrate, wherein said LDD region and said source/drain region having a second conductive type;

forming a pad nitride layer on the first pad oxide layer;

forming a trench through sequential etching desired parts of the pad nitride layer, the first pad oxide layer, the source/drain region, and the LDD region to expose side surfaces of the source/drain region and the LDD region;

forming a second pad oxide layer along the exposed side surfaces of the source/drain region, the LDD region and on a bottom of the trench;

removing a portion of the second pad oxide layer formed at the bottom of the trench and portions of the LDD region and the upper pan of the well region;

forming a gate in the trench;

forming an interlayer insulating layer on the surface of the silicon substrate including the gate;

etching the interlayer insulating layer to form contact holes; and forming a source electrode, a drain electrode, and a gate electrode, each of which is electrically connected with the source/drain region and the gate.

2. The method for fabricating a highly integrated transistor according to claim 1, wherein the sequential etching for forming the trench is controlled so that the sequential etching can be stopped at the inside of the LDD region.

3. The method for fabricating a highly integrated transistor accordingly to claim 2, wherein the sequential etching is performed in a condition where the etch selection rate between the source/drain region, the LDD region, and the first pad oxide layer with respect to the pad nitride layer is chosen to be 1:1:1.

4. The method for fabricating a highly integrated transistor according to claim 1, wherein the thicknesses of the second pad oxide layer formed on the exposed side surfaces of the source/drain region and the LDD region differ from one another.

5. The method for fabricating a highly integrated transistor according to claim 1, wherein the second pad oxide Layer is formed by thermal oxidation process.

6. The method for fabricating a highly integrated transistor according to claim 1, wherein the step of removing a portion of the second pad oxide layer and portions of the LDD region and the upper part of the well region is performed by anisotropic dry etching.

7. The method for fabricating a highly integrated transistor according to claim 1, further comprising a step of forming a doped region for controlling a threshold voltage at the lower part of the trench prior to the step of forming the gate.

8. The method for fabricating a highly integrated transistor according to claim 7, wherein the step of forming the doped region for controlling the threshold voltage comprising the steps of:

forming a sacrificial oxide layer;

implanting ions; and removing the sacrificial oxide layer.

9. The method for fabricating a highly integrated transistor according to claim 1, wherein the step of forming the gate comprises the steps of:

depositing the gate forming materials to fill the trench; and performing planarization of the deposited gate forming materials.

10. The method for fabricating a highly integrated transistor according to claim 1, further comprising the step of forming silicide layers on both the gate and the source/drain region by a self-alignment method after the step of forming the gate.

11. The method for fabricating a highly integrated transistor according to claim 1, further comprising the step of removing the pad nitride layer prior to the step of forming of the interlayer insulating layer.

* * * * *